US012488959B2

(12) United States Patent
Yasui et al.

(10) Patent No.: US 12,488,959 B2
(45) Date of Patent: Dec. 2, 2025

(54) COVERAGE CALCULATING METHOD, CHARGED PARTICLE BEAM WRITING METHOD, COVERAGE CALCULATING DEVICE, CHARGED PARTICLE BEAM WRITING APPARATUS, AND COMPUTER-READABLE STORAGE MEDIUM

(71) Applicant: NuFlare Technology, Inc., Yokohama (JP)

(72) Inventors: Kenichi Yasui, Kawasaki (JP); Yasuo Kato, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 419 days.

(21) Appl. No.: 18/299,749

(22) Filed: Apr. 13, 2023

(65) Prior Publication Data

US 2023/0369015 A1 Nov. 16, 2023

(30) Foreign Application Priority Data

May 13, 2022 (JP) ................................ 2022-079606

(51) Int. Cl.
*H01J 37/317* (2006.01)
*H01J 37/04* (2006.01)
*H01J 37/302* (2006.01)

(52) U.S. Cl.
CPC ........ *H01J 37/3177* (2013.01); *H01J 37/045* (2013.01); *H01J 37/3026* (2013.01); *H01J 2237/31762* (2013.01)

(58) Field of Classification Search
CPC .. H01J 37/3026; H01J 37/3177; H01J 37/045; H01J 37/304; H01J 37/3174;
(Continued)

(56) References Cited

U.S. PATENT DOCUMENTS 7,608,844 B2 10/2009 Inoue et al.
7,652,677 B2 1/2010 Dorbie et al.
(Continued)

FOREIGN PATENT DOCUMENTS

JP 2005-340438 A 12/2005
JP 2012-230689 A 11/2012
(Continued)

OTHER PUBLICATIONS

Korean Notice of Allowance issued May 9, 2025 in Korean Patent Application No. 10-2023-0060241 with English Machine translation, 4 pgs.

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

In one embodiment, a coverage calculating method is for calculating a coverage of a pattern in each of pixel regions obtained by dividing a writing region onto which the pattern is to be written by irradiation with a charged particle beam. Each of the pixel regions has a predetermined size. The method includes generating a plurality of first pixel regions by virtually dividing the writing region, the first pixel regions each having a first size, calculating a coverage of a pattern in the first pixel region, generating a plurality of second pixel regions by virtually dividing the first pixel region, the second pixel regions each having a second size smaller than the first size, selecting a second pixel region approximating a pattern shape in the first pixel region, and calculating a coverage in the selected second pixel region.

9 Claims, 5 Drawing Sheets

(58) Field of Classification Search
CPC .. H01J 2237/31762; H01J 2237/31764; G03F 7/70483; G03F 7/70616; G03F 7/70633
See application file for complete search history.

(56) References Cited

U.S. PATENT DOCUMENTS

| | | | | |
|---|---|---|---|---|
| 7,750,324 | B2 * | 7/2010 | Oogi ...................... | B82Y 10/00 250/492.23 |
| 11,749,499 | B2 * | 9/2023 | Yasui .................. | H01J 37/3177 250/492.22 |
| 2010/0020096 | A1 | 1/2010 | Tomaru et al. | |

FOREIGN PATENT DOCUMENTS

| | | | |
|---|---|---|---|
| JP | 5127581 | B2 | 1/2013 |
| KR | 10-2009-0025162 | A | 3/2009 |
| KR | 10-2022-0041001 | A | 3/2022 |
| WO | WO 2008/084543 | A1 | 7/2008 |

* cited by examiner

FIG.6A
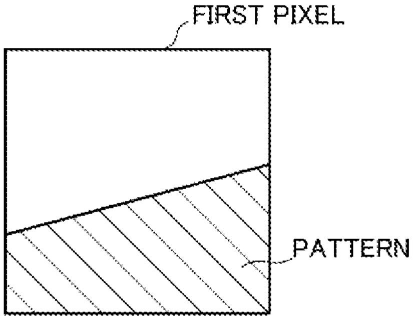
COVERAGE A = 0.4
FIG.6B
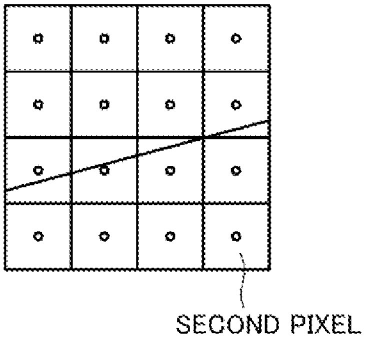
FIG.6C
| | | | |
|---|---|---|---|
| 0 | 0 | 0 | 0 |
| 0 | 0 | 0 | 0 |
| 0 | 1 | 1 | 1 |
| 1 | 1 | 1 | 1 |
FIG.7
| | | | |
|---|---|---|---|
| 0 | 0 | 0 | 0 |
| 0 | 0 | 0 | 0 |
| 0 | 0.91 | 0.91 | 0.91 |
| 0.91 | 0.91 | 0.91 | 0.91 |

COVERAGE = 0.5
NUMBER OF CALCULATIONS : 1
MEMORY USAGE : 2byte

NUMBER OF CALCULATIONS : 4
MEMORY USAGE : 32byte

COVERAGE CALCULATING METHOD, CHARGED PARTICLE BEAM WRITING METHOD, COVERAGE CALCULATING DEVICE, CHARGED PARTICLE BEAM WRITING APPARATUS, AND COMPUTER-READABLE STORAGE MEDIUM

CROSS REFERENCE TO RELATED APPLICATION

This application is based upon and claims benefit of priority from the Japanese Patent Application No. 2022-79606, filed on May 13, 2022, the entire contents of which are incorporated herein by reference.

FIELD

The present invention relates to a coverage calculating method, a charged particle beam writing method, a coverage calculating device, a charged particle beam writing apparatus, and a computer-readable storage medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern formed on a quartz is employed. The highly precise original image pattern is formed by exposing a resist using an electron beam writing apparatus, in which a technology commonly known as electron beam lithography is used.

As an electron beam writing apparatus, for example, a multi-beam writing apparatus that emits multiple beams at a time to improve throughput has been known. In this multi-beam writing apparatus, for example, an electron beam emitted from an electron gun passes through an aperture member having many apertures to form multiple beams, each of which is blanking-controlled by a blanking plate. Beams not blocked by the blanking plate are reduced by an optical system and projected at desired positions on a mask (writing target).

The multi-beam writing apparatus determines the coverage (area density) of a pattern for each of pixels obtained by dividing a writing region into a mesh, and adjusts the dosage of each of multiple beams in accordance with the coverage. A smaller pixel size means more accurate reflection of the pattern shape and improved resolution and writing accuracy. However, a smaller pixel size also means longer time required to calculate the coverages and larger memory usage for storing the result of calculations of the coverages.

For example, when the pixel size (or the length of each side of a pixel) is reduced from 16 nm to 4 nm as illustrated in FIG. 9A and FIG. 9B, the number of calculations of coverages is increased from one to four. The memory usage for storing the result of calculations of the coverages is increased from 2 bytes to 32 bytes. Multiplying the pixel size by 1/n (where n is an integer greater than or equal to 2) increases the number of calculations to n times the original, and increases the memory usage to $n^2$ times the original.

BRIEF DESCRIPTION OF THE DRAWINGS

FIG. 6A is a diagram illustrating a coverage in a first pixel, FIG. 6B is a diagram illustrating second pixels into which the first pixel is divided, and FIG. 6C is a diagram illustrating in/out determination information of the second pixels.

FIG. 7 is a diagram illustrating coverages in the second pixels.

DETAILED DESCRIPTION

In one embodiment, a coverage calculating method is for calculating a coverage of a pattern in each of pixel regions obtained by dividing a writing region onto which the pattern is to be written by irradiation with a charged particle beam. Each of the pixel regions has a predetermined size. The coverage calculating method includes generating a plurality of first pixel regions by virtually dividing the writing region, the first pixel regions each having a first size, calculating a coverage of a pattern in the first pixel region, generating a plurality of second pixel regions by virtually dividing the first pixel region, the second pixel regions corresponding to the pixel region and each having a second size smaller than the first size, selecting a second pixel region approximating a pattern shape in the first pixel region, and calculating a coverage in the selected second pixel region based on the coverage of the pattern in the first pixel region, the number of the second pixel regions in the first pixel region, and the number of selected second pixel regions.

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
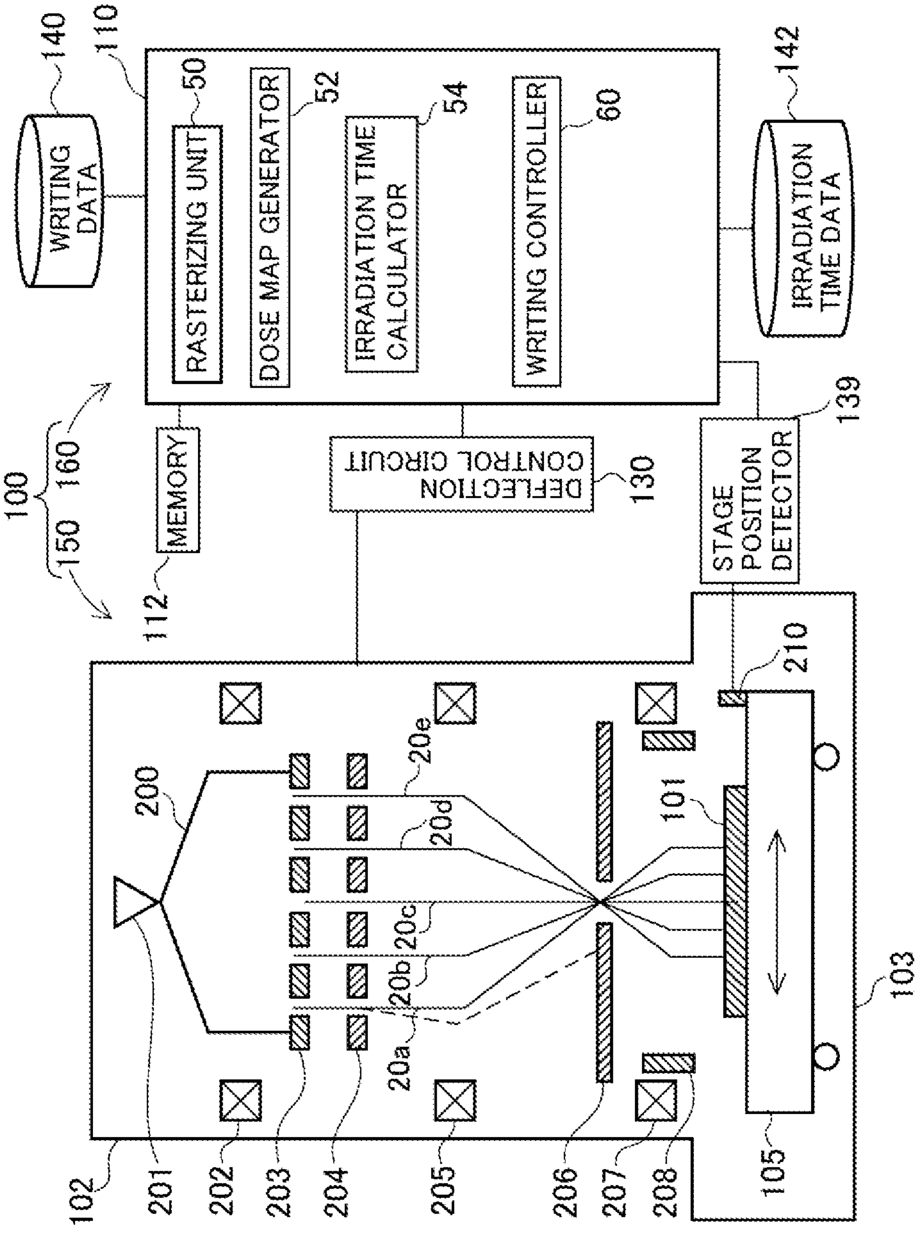
FIG. 1 is a schematic diagram of a multi charged particle beam writing apparatus according to an embodiment of the present invention.

FIG. 1 is a schematic diagram of a writing apparatus using a coverage calculating device according to an embodiment. As illustrated in FIG. 1, a writing apparatus 100 includes a writing unit 150 and a control unit 160. The writing apparatus 100 is an example of a multi charged particle beam writing apparatus.

The writing unit 150 includes an electron optical column 102 and a writing chamber 103. The electron optical column 102 includes therein an electron gun 201, an illuminating lens 202, an aperture member 203, a blanking plate 204, a reducing lens 205, a limiting aperture member 206, an objective lens 207, and a deflector 208.

A continuously movable XY stage 105 is disposed in the writing chamber 103. The XY stage 105 has thereon a substrate 101 (writing target) during writing. Examples of the substrate 101 include an exposure mask used to manufacture semiconductor devices, and a semiconductor substrate (silicon wafer) on which semiconductor devices are formed. The substrate 101 may be a resist-coated mask blank on which nothing has yet been written. A mirror 210 for measuring the position of the XY stage 105 is disposed on the XY stage 105.

The control unit 160 includes a control computer 110, a memory 112, a deflection control circuit 130, a stage position detector 139, and storage devices 140 and 142, such as magnetic disk devices. These components are connected to each other via a bus. Writing data received from outside is stored in the storage device 140.

The control computer 110 includes a rasterizing unit 50, a dose map generator 52, an irradiation time calculator 54, and a writing controller 60. These functions may be configured by hardware, such as an electric circuit, or by software. When configured by software, a program implementing at least some of the functions may be stored in a non-transitory recording medium and loaded into and executed by a computer including a CPU. The recording medium for storing the program is not limited to a removable medium, such as a magnetic disk or an optical disk, and may be a fixed recording medium, such as a hard disk drive or a memory. Information, such as a result of computation in the control computer 110, is stored in the memory 112 after each computation. The rasterizing unit 50 and the dose map generator 52 execute processing of the coverage calculating device according to the present embodiment.

Figure 2:
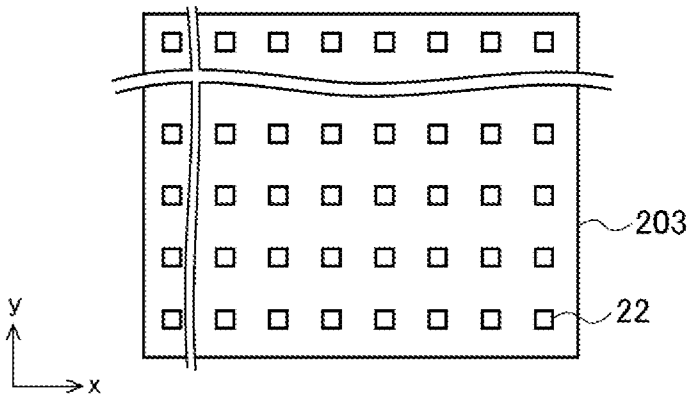
FIG. 2 is a diagram illustrating an example of a configuration of an aperture member.

FIG. 2 is a conceptual diagram illustrating an example of a configuration of the aperture member 203. In FIG. 2, the aperture member 203 has a plurality of apertures 22 formed in a matrix with a predetermined array pitch. For example, a 512×512 matrix of apertures 22 is formed in the x and y directions. The apertures 22 are rectangular apertures having the same dimensions. The apertures 22 may be circular.

The electron beam 200 partially passes through the plurality of apertures 22 to form multiple beams **20*a* to 20*e*. Although the apertures 22 are arranged in two or more rows in both the x and y directions in this example, the arrangement is not limited to this. For example, the apertures 22** may be arranged in multiple rows in one of the x and y directions and arranged in a single row in the other direction.

For passage of the multiple beams, the blanking plate 204 has passage holes (apertures) that open at positions corresponding to the respective apertures 22 in the aperture member 203 illustrated in FIG. 2. A pair of electrodes (blankers or blanking deflectors) for blanking deflection is disposed, with each passage hole interposed therebetween. One of the two electrodes is applied with a deflection voltage based on a control signal from the deflection control circuit 130, and the other electrode is grounded.

The electron beams **20*a* to 20*e* passing through the passage holes are independently deflected by the blankers for blanking control. The multiple beams passing through the plurality of apertures 22 in the aperture member 203** are thus subjected to blanking deflection by the corresponding blankers.

Figure 3:
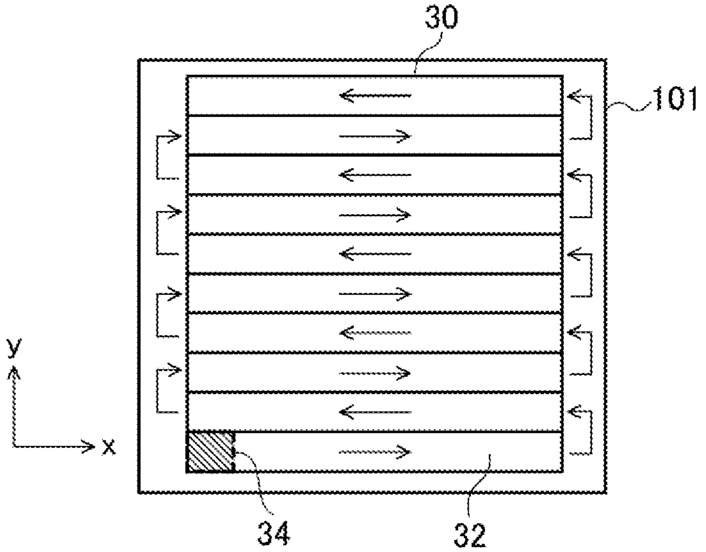
FIG. 3 is a diagram illustrating an example of a writing operation.

FIG. 3 is a conceptual diagram illustrating an example of a writing operation. As illustrated in FIG. 3, a writing region 30 of the substrate 101 is virtually divided, for example, into a plurality of strip-shaped stripe regions 32 each having a predetermined width in the y direction.

To start writing, the XY stage 105 is first moved and adjusted such that an irradiation region 34 is located at the left end of, or to the left of, the first stripe region 32. The irradiation region 34 is a region that can be irradiated by a single irradiation with multiple beams 20. For writing in the first stripe region 32, the XY stage 105 is moved, for example, in the −x direction to allow writing to advance relatively in the x direction. For example, the XY stage 105 is continuously moved at a predetermined speed.

After completion of writing in the first stripe region 32, the stage position is moved in the −y direction and adjusted such that the irradiation region 34 is located at the right end of, or to the right of, the second stripe region 32 relatively in the y direction. Then, the XY stage 105 is moved, for example, in the x direction to similarly perform writing in the −x direction.

Writing advances in the x direction in the third stripe region 32, and advances in the −x direction in the fourth stripe region 32. By thus performing writing while alternately changing the direction, the writing time can be shortened. The writing does not necessarily need to be performed while alternately changing the direction. The writing in each stripe region 32 may be performed in the same direction. By one shot, a plurality of shot patterns equal in number to the apertures 22 in the aperture member 203, at the maximum, are formed at a time by multiple beams formed by passage through the apertures 22.

Figure 4:
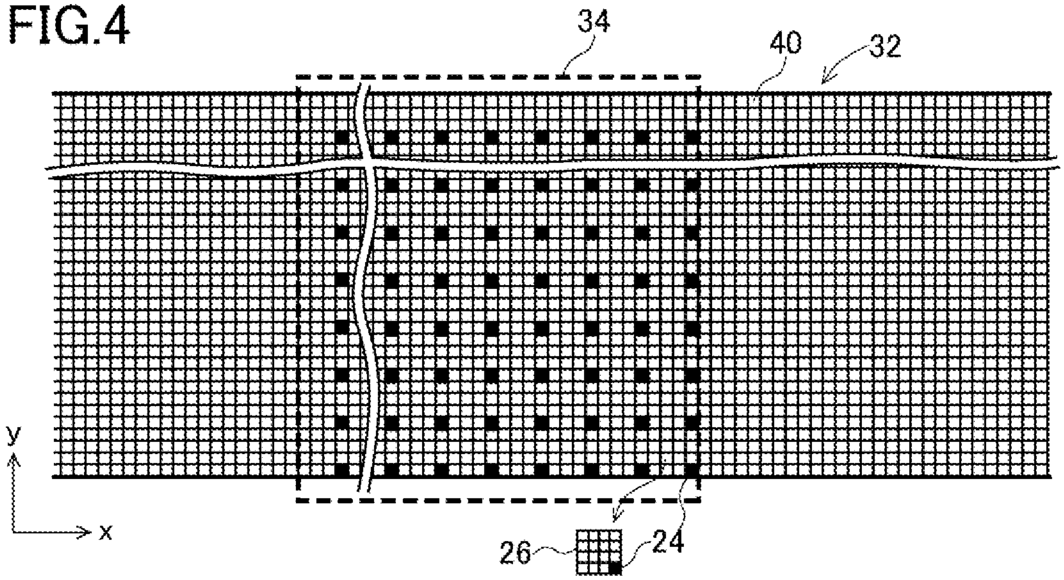
FIG. 4 is a diagram illustrating an example of a multiple beam irradiation region and writing target pixels.

FIG. 4 is a diagram illustrating an example of a multiple beam irradiation region and writing target pixels. In FIG. 4, for example, the stripe region 32 is divided into a plurality of mesh regions 40, each having a beam size of multiple beams. Each of the mesh regions 40 serves as a writing pixel region (writing position). FIG. 4 illustrates an example in which the writing region of the substrate 101 is divided in the y direction into a plurality of stripe regions 32, each having a width size smaller than the size (shot size) of the irradiation region 34 that can be irradiated by a single irradiation with the multiple beams **20*a* to 20*e*. The width of the stripe region 32 is not limited to this. For example, the stripe region 32 may have a width n times the size of the irradiation region 34** (where n is an integer greater than or equal to 1).

The irradiation region 34 includes a plurality of pixels 24 (beam writing positions) that can be irradiated by a single irradiation with the multiple beams **20*a* to 20*e*. In other words, a pitch between adjacent pixels 24 is a pitch between multiple beams. In the example illustrated in FIG. 4, a square region surrounded by four adjacent pixels 24 and including one of the four pixels 24 constitutes one sub-pitch region 26. In FIG. 4, each sub-pitch region 26** is composed of 4×4 pixels.

The size of each writing pixel region is a beam size in FIG. 4. A writing pixel region with a smaller size means more accurate reflection of a pattern shape and improved resolution and writing accuracy.

The operation of the writing unit 150 will now be described. The illuminating lens 202 substantially perpendicularly illuminates the entire aperture member 203 with the electron beam 200 emitted from the electron gun 201 (emitting unit). The electron beam 200 passes through the plurality of apertures 22 in the aperture member 203 to form, for example, a plurality of rectangular electron beams (multiple beams) **20*a* to 20*e*. The multiple beams 20*a* to 20*e* pass through the corresponding blankers in the blanking plate 204. The blankers each deflect the electron beam 20 passing therethrough (or perform blanking deflection) in such a way that the electron beam 20** is in the beam ON state only during the computed writing period (irradiation time) and is in the beam OFF state during the non-writing period.

After passing through the blanking plate 204, the multiple beams **20*a* to 20*e* are reduced by the reducing lens 205 and move toward an aperture in the center of the limiting aperture member 206. The electron beam deflected to be in the beam OFF state by the blanker in the blanking plate 204** is deviated from the aperture in the center of the limiting aperture member 206 (blanking aperture member) and blocked by the limiting aperture member 206. On the other hand, the electron beam not deflected (or deflected to be in the beam ON state) by the blanker in the blanking plate 204 passes through the aperture in the center of the limiting aperture member 206.

Beams formed after the beam ON state is entered and before the beam OFF state is entered pass through the limiting aperture member 206 and constitute beams of one shot. The multiple beams passing through the limiting aperture member 206 are brought into focus by the objective lens 207 and formed into a pattern image reduced to a desired reduction ratio. The beams (all the multiple beams 20) are deflected together in the same direction by the deflector 208 and projected at the corresponding writing positions (irradiation positions) on the substrate 101.

During continuous movement of the XY stage 105, the beam writing position (irradiation position) is tracking-controlled by the deflector 208 to follow the movement of the XY stage 105. The mirror 210 on the XY stage 105 is irradiated with laser from the stage position detector 139 to measure the position of the XY stage 105 by using the reflected light from the mirror 210. Ideally, multiple beams with which to irradiate at a time are arranged with a pitch obtained by multiplying the array pitch of the plurality of apertures in the aperture member 203 by the desired reduction ratio described above.

During each tracking operation, the writing apparatus 100 performs irradiation with multiple beams constituting a shot beam by sequentially shifting the writing position while following the movement of the XY stage 105.

Figure 5:
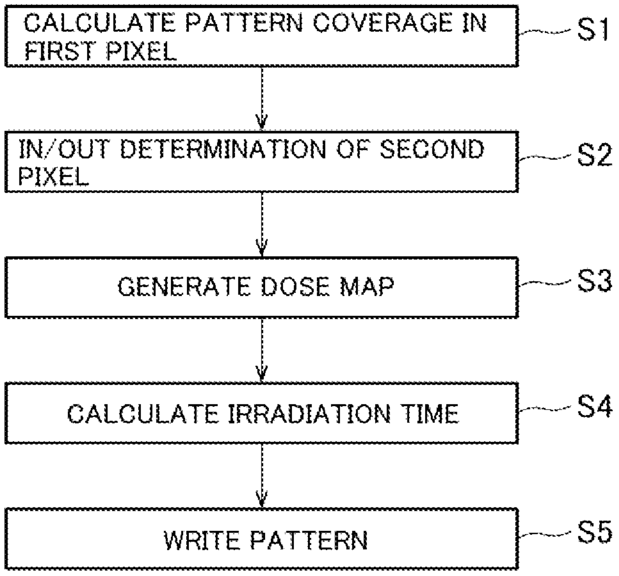
FIG. 5 is a flowchart illustrating a writing method according to the embodiment.

FIG. 5 is a flowchart illustrating a writing method according to an embodiment.

The rasterizing unit 50 reads writing data from the storage device 140 and calculates a pattern coverage (hereinafter referred to as a coverage) in each of first pixel regions (step S1). The first pixel regions are a mesh of regions each having a first size M1 and obtained by virtually dividing the writing region (e.g., stripe region 32). The first size M1 is, for example, the size of each of the multiple beams (i.e., the size of an individual beam). The coverage in the first pixel region is stored in the memory 112.

Next, the rasterizing unit 50 virtually divides each first pixel region into a mesh of second pixel regions, each having a second size M2 smaller than the first size M1. The second pixel region corresponds to the writing pixel region. Hereinafter, the first pixel region, the second pixel region, and the writing pixel region will be referred to as a first pixel, a second pixel, and a writing pixel, respectively. The rasterizing unit 50 inspects each second pixel to determine whether the center of the second pixel is included in the pattern. A second pixel whose center is included in the pattern is determined to be a second pixel located inside the pattern (step S2). Note that “the center of the second pixel is included in the pattern” means that “the center of the second pixel is located on the pattern”. A second pixel group located inside the pattern approximates the pattern shape.

A second pixel whose center is not included in the pattern is determined to be a second pixel located outside the pattern. For each second pixel, in/out determination information indicating whether the second pixel is located inside or outside the pattern is stored in the memory 112.

For example, in step S1, the coverage in each first pixel is calculated as illustrated in FIG. 6A. A coverage A in the first pixel is stored in the memory 112, for example, with a 16-bit precision.

As illustrated in FIG. 6B, in step S2, the first pixel having the first size M1 is virtually divided into second pixels each having the second size M2. In this example, the second size M2 is a quarter of the length of one side of the first size M1 (i.e., M1/M2=4), and the first pixel is virtually divided into 16 second pixels.

Then, an inspection is made to determine whether the center of each second pixel is included in the pattern. In the example illustrated in FIG. 6B, four second pixels in the bottom row and three second pixels that are the first to third pixels from the right in the second row from the bottom, are pixels whose centers are included in the pattern. These seven second pixels are thus determined to be located inside the pattern. One second pixel that is the first pixel from the left in the second row from the bottom, four second pixels in the top row, and four second pixels in the second row from the top, are pixels whose centers are not included in the pattern. These nine second pixels are thus determined to be located outside the pattern.

For each second pixel, 1-bit in/out determination information is stored in the memory 112. The in/out determination information is “1” for a second pixel whose center is located inside the pattern, and “0” for a second pixel whose center is located outside the pattern. For example, as illustrated in FIG. 6C, for 16 second pixels into which a first pixel is virtually divided, 16-bit in/out determination information is stored in the memory 112.

Next, the dose map generator 52 virtually divides the writing region (e.g., stripe region 32) into a mesh of proximity mesh regions (i.e., mesh regions for proximity effect correction calculation) each having a predetermined size. The size of each proximity mesh region is preferably set to about 1/10 of the area of influence of proximity effect, that is, for example, about 1 μm. The dose map generator 52 reads writing data from the storage device 140 and calculates a coverage ρ of a pattern positioned in each proximity mesh region.

Next, for each proximity mesh region, the dose map generator 52 computes a proximity effect correction irradiation coefficient Dp(x) for correcting the proximity effect. The proximity effect correction irradiation coefficient Dp(x) can be defined by a threshold model for proximity effect correction using a backscattering coefficient η, a dosage threshold Dth for the threshold model, the coverage ρ, and a distribution function g(x), similar to an existing technique.

Next, for each writing pixel (second pixel), the dose map generator 52 computes an incident dosage D (dosage) for irradiating the writing pixel. The incident dosage D can be computed as a value obtained, for example, by multiplying a preset base dosage Dbase by the proximity effect correction irradiation coefficient Dp and the coverage ρ' in the writing pixel.

The base dosage Dbase can be defined, for example, by Dth/(½+η).

For calculating the coverage ρ' in the writing pixel, the dose map generator 52 reads, from the memory 112, the coverage A in the first pixel including the writing pixel and the in/out determination information. From equation (1), the dose map generator 52 calculates the coverage ρ' in the writing pixel with the in/out determination information “1” by using the read coverage A in the first pixel, the number $N_{IN}$ of writing pixels with the in/out determination information “1” in the first pixel, the size M1 of the first pixel, and the size M2 of the writing pixel. Note that $(M1/M2)^2$ in equation (1) below represents the number of writing pixels in the first pixel.

$$\rho'=(A/N_{IN})\times(M1/M2)^2 \quad (1)$$

The dose map generator 52 determines that the coverage ρ' in the writing pixel (second pixel) with the in/out determination information "0" is 0.

When the coverage A in the first pixel is 0.4 in the example illustrated in FIGS. 6A to 6C, the coverages ρ' in 16 writing pixels in the first pixel are as illustrated in FIG. 7.

The dose map generator 52 thus calculates the incident dosage D(x) for each of the writing pixels on which the proximity effect has been corrected, based on the layout of a plurality of figure patterns defined in the writing data.

The dose map generator 52 then generates, on a stripe-by-stripe basis, a dose map which defines the incident dosage D for each writing pixel (step S3). The dose map thus generated is stored, for example, in the storage device 142.

The irradiation time calculator 54 refers to the latest dose map to calculate an irradiation time t corresponding to the dosage D for each writing pixel (step S4). The irradiation time t is calculated by dividing the dosage D by a current density. The irradiation time t for each writing pixel is computed as a value within the maximum amount of irradiation time during which the writing pixel can be irradiated by one shot of multiple beams 20. Irradiation time data is stored in the storage device 142.

In a writing step (step S5), the writing controller 60 rearranges the irradiation time data in the order of shots along a writing sequence. The irradiation time data is then transferred to the deflection control circuit 130 in the order of shots. The deflection control circuit 130 outputs a deflection control signal to the deflector 208 in the order of shots while outputting a blanking control signal to the blanking plate 204 in the order of shots. The writing unit 150 writes a pattern on the substrate 101 using multiple beams with a dosage calculated for each writing pixel.

Figure 9A:
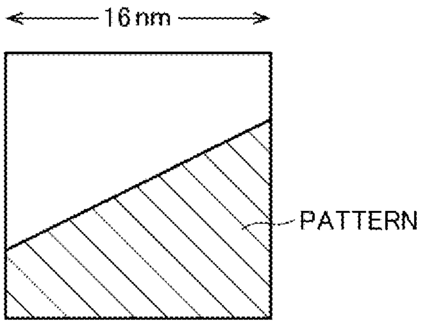
FIG. 9A and FIG. 9B are diagrams illustrating the number of calculations of coverages in a comparative example.
Figure 9B:
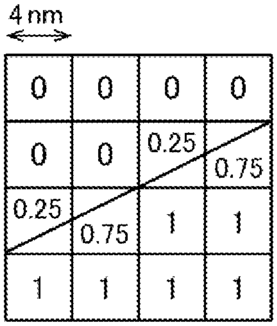

In the example illustrated in FIG. 9B, rasterization requires memory usage of 32 bytes for storing the result of calculations of coverages for 16 pixels. However, it is simply required in the present embodiment that the coverage (16 bits) in the first pixel and the in/out determination information (16 bits) for the 16 second pixels be stored. This can reduce the memory usage to 4 bytes, and can also reduce the number of coverage calculations and the amount of calculation.

In the embodiment described above, an inspection is made to determine whether the center of each of second pixels into which a first pixel is virtually divided is located inside or outside the pattern, and a second pixel whose center is located inside the pattern is selected as a second pixel which approximates the pattern shape. A second pixel which approximates the pattern shape may be selected by taking into consideration the position of the center of gravity of the pattern in the first pixel.

Figure 8A:
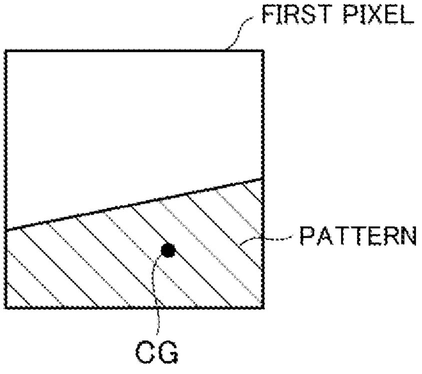
FIG. 8A is a diagram illustrating the position of the center of gravity of the pattern in the first pixel.

For example, as illustrated in FIG. 8A, the rasterizing unit 50 determines the center of gravity CG of the pattern in the first pixel while calculating the coverage A in the first pixel.

Figure 8B:
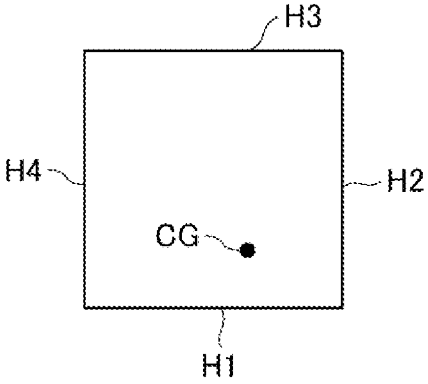
FIG. 8B to FIG. 8D are diagrams illustrating a method of selecting second pixels.

Next, as illustrated in FIG. 8B, the rasterizing unit 50 selects a side closest to the center of gravity CG from four sides H1 to H4 of the rectangular first pixel. In the example illustrated in FIG. 8B, the side H1 at the bottom of the drawing is closest to the center of gravity CG.

Next, the rasterizing unit 50 selects a plurality of second pixels (second pixel group) approximating the pattern shape in the first pixel. For example, in the direction from the side H1 closest to the center of gravity CG of the pattern toward the side H3 opposite the side H1, the rasterizing unit 50 selects a second pixel group composed of k rows parallel to the side H1, where k is calculated from equation (2) using the coverage A in the first pixel, the size M1 of the first pixel, and the size M2 of the second pixel.

$$k=\mathrm{ceil}(A\times(M1/M2)) \quad (2)$$

Figure 8C:
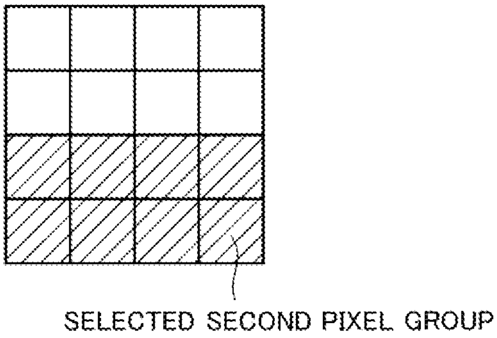

For example, k is 2 when A is 0.4 and the first pixel is virtually divided into 16 second pixels (M1/M2=4). Thus, as illustrated in FIG. 8C, a second pixel group composed of two rows from the side H1 toward the side H3 (i.e., two rows on the lower side) is selected.

Figure 8D:
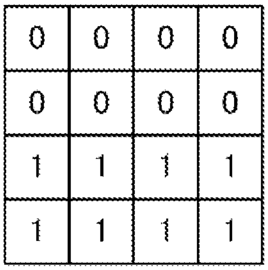

As illustrated in FIG. 8D, for each second pixel, 1-bit selection information is stored in the memory 112 along with the coverage A in the first pixel. The 1-bit selection information is "1" when the second pixel is selected and "0" when the second pixel is not selected.

From equation (3), the dose map generator 52 calculates the coverage ρ' in the writing pixel (second pixel) with the selection information "1" by using the coverage A in the first pixel, the number $N_{SEL}$ of the writing pixels with the selection information "1", the size M1 of the first pixel, and the size M2 of the writing pixel.

$$\rho'=(A/N_{SEL})\times(M1/M2)^2 \quad (3)$$

The dose map generator 52 determines that the coverage ρ' in the writing pixel (second pixel) with the selection information "0" is 0.

As described above, a second pixel group approximating the pattern shape is selected on the basis of the position of the center of gravity of the pattern in the first pixel, and the coverage is assigned to the selected second pixels. This can also reduce the amount of calculation of pixel coverage and the memory usage, as in the embodiment described above.

In the embodiment, a multi-beam writing apparatus has been described as an example of the charged particle beam apparatus to which the coverage calculating device is applied. The coverage calculating device is also applicable to a single-beam writing apparatus. The coverage calculating device is applicable not only to a writing apparatus, but also to an inspecting apparatus. In inspection, the inspecting apparatus compares the coverage in the second pixel calculated from writing data by the coverage calculating method according to the embodiment, with the coverage in the second pixel based on the result of measurement of a pattern actually written on the writing target substrate by using the writing data, and determines whether they match.

The coverage calculating method according to the above embodiment is preferably applied to situations where high accuracy is not required, such as when the second pixel is smaller than the beam blur. In this case, the irradiation amount may be stored in units of regions having a size of the first pixel, and the edge position information is required to have a resolution of about the second pixel.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A coverage calculating method for calculating a coverage of a pattern in each of pixel regions obtained by dividing a writing region onto which the pattern is to be written by irradiation with a charged particle beam, the pixel regions each having a predetermined size, the coverage calculating method comprising:

generating a plurality of first pixel regions by virtually dividing the writing region, the first pixel regions each having a first size;

calculating a coverage of a pattern in the first pixel region;

generating a plurality of second pixel regions by virtually dividing the first pixel region, the second pixel regions corresponding to the pixel region and each having a second size smaller than the first size;

selecting a second pixel region approximating a pattern shape in the first pixel region; and calculating a coverage in the selected second pixel region based on the coverage of the pattern in the first pixel region, the number of the second pixel regions in the first pixel region, and the number of selected second pixel regions.

2. The coverage calculating method according to claim 1, wherein from the plurality of second pixel regions, a second pixel region whose center is located inside the pattern is selected as the second pixel region approximating the pattern shape.

3. The coverage calculating method according to claim 1, wherein a center of gravity of the pattern in the first pixel region is detected;

from four sides of the first pixel region rectangular in shape, a first side closest to the center of gravity is selected;

in a direction from the first side toward a second side opposite the first side, second pixel regions in k rows parallel to the first side are selected as the second pixel regions approximating the pattern shape, where k is an integer greater than or equal to 1; and k is a value based on the coverage in the first pixel region, the first size, and the second size.

4. A charged particle beam writing method comprising:

calculating a dosage for each of the pixel regions by using the coverage in the second pixel region calculated by the coverage calculating method according to claim 1; and writing the pattern on a substrate by controlling the charged particle beam based on the calculated dosage.

5. A coverage calculating device that emits a charged particle beam and calculates a coverage of a pattern in each of pixel regions obtained by dividing a writing region onto which the pattern is to be written, the pixel regions each having a predetermined size, the coverage calculating device comprising:

a rasterizing unit generating a plurality of first pixel regions each having a first size by virtually dividing the writing region, calculating a coverage of a pattern in the first pixel region, generating a plurality of second pixel regions corresponding to the pixel region and each having a second size smaller than the first size by virtually dividing the first pixel region, and selecting a second pixel region approximating a pattern shape in the first pixel region, wherein a coverage in the selected second pixel region is calculated based on the coverage of the pattern in the first pixel region, the number of the second pixel regions in the first pixel region, and the number of selected second pixel regions.

6. The coverage calculating device according to claim 5, wherein from the plurality of second pixel regions, the rasterizing unit selects, as the second pixel region approximating the pattern shape, a second pixel region whose center is located inside the pattern.

7. The coverage calculating device according to claim 5, wherein the rasterizing unit detects a center of gravity of the pattern in the first pixel region, selects a first side closest to the center of gravity from four sides of the first pixel region rectangular in shape, and selects second pixel regions in k rows parallel to the first side, in a direction from the first side toward a second side opposite the first side, as second pixel regions approximating the pattern shape, where k is an integer greater than or equal to 1; and k is a value based on the coverage in the first pixel region, the first size, and the second size.

8. A charged particle beam writing apparatus comprising:

a dose map generator generating a dose map by calculating a dosage for each of the pixel regions by using the coverage in the second pixel region calculated by the coverage calculating device according to claim 5, the dose map defining the dosage for each of the pixel regions;

an irradiation time calculator calculating an irradiation time for each of the pixel regions on the basis of the dose map; and a writing controller controlling a dosage of the charged particle beam on the basis of the calculated irradiation time.

9. A non-transitory computer-readable storage medium storing a program which causes a computer to execute the steps of:

generating a plurality of first pixel regions by virtually dividing a writing region, the first pixel regions each having a first size, and the writing region being written a pattern by irradiation with a charged particle beam;

calculating a coverage of a pattern in the first pixel region;

generating a plurality of second pixel regions by virtually dividing the first pixel region, the second pixel regions each having a second size smaller than the first size;

selecting a second pixel region approximating a pattern shape in the first pixel region; and calculating a coverage in the selected second pixel region based on the coverage of the pattern in the first pixel region, the number of the second pixel regions in the first pixel region, and the number of selected second pixel regions.

* * * * *